(12) United States Patent
Francis

(10) Patent No.: US 12,015,419 B2
(45) Date of Patent: Jun. 18, 2024

(54) SWITCHED CAPACITOR CIRCUITRY FOR MITIGATING POLE-ZERO DOUBLET ERRORS IN AN ANALOG CIRCUIT

(71) Applicant: XILINX, INC., San Jose, CA (US)

(72) Inventor: Roswald Francis, Kildare (IE)

(73) Assignee: XILINX, INC., San Jose, CA (US)

( * ) Notice: Subject to any disclaimer, the term of this patent is extended or adjusted under 35 U.S.C. 154(b) by 140 days.

(21) Appl. No.: 17/829,297

(22) Filed: May 31, 2022

(65) Prior Publication Data

US 2023/0403021 A1    Dec. 14, 2023

(51) Int. Cl.
*H03M 1/10*    (2006.01)

(52) U.S. Cl.
CPC .................................. *H03M 1/1033* (2013.01)

(58) Field of Classification Search
CPC .................................................... H03M 1/1033
See application file for complete search history.

(56) References Cited

U.S. PATENT DOCUMENTS

| | | | | |
|---|---|---|---|---|
| 5,684,487 A * | 11/1997 | Timko | ................ | H03M 1/1047 341/172 |
| 5,771,012 A * | 6/1998 | Shu | ..................... | H03M 1/1009 341/120 |
| 6,707,403 B1 * | 3/2004 | Hurrell | ............... | H03M 1/1061 341/172 |
| 7,812,757 B1 * | 10/2010 | Wong | .................... | H03M 1/468 341/172 |
| 7,830,159 B1 * | 11/2010 | Lee | ..................... | G01R 27/2605 341/120 |
| 8,754,794 B1 * | 6/2014 | Li | ........................ | H03M 1/1057 341/161 |
| 9,531,400 B1 * | 12/2016 | Wen | ..................... | H03M 1/0692 |
| 9,602,119 B1 * | 3/2017 | Maulik | ............... | H03M 1/1014 |
| 9,698,804 B1 * | 7/2017 | Funato | ................ | H03M 1/0617 |
| 9,748,969 B1 * | 8/2017 | Bach | ..................... | H03M 3/496 |
| 11,239,853 B1 * | 2/2022 | Dai | ....................... | H03M 1/804 |
| 2007/0075884 A1 * | 4/2007 | Melanson | ........... | H03M 1/1038 341/120 |
| 2009/0278716 A1 * | 11/2009 | Kawahito | ............ | G11C 27/026 341/122 |
| 2013/0187802 A1 * | 7/2013 | de Figueiredo | ..... | H03M 1/1009 341/118 |
| 2015/0263756 A1 * | 9/2015 | Chiu | ....................... | H03M 1/08 341/172 |
| 2019/0097645 A1 * | 3/2019 | Wu | ..................... | H03M 1/1057 |

(Continued)

*Primary Examiner* — Lam T Mai
(74) *Attorney, Agent, or Firm* — Patterson + Sheridan, LLP

(57) ABSTRACT

Examples describe a switched capacitor (SC) circuitry calibrated to mitigate the pole-zero (PZ) doublet errors that occur in an analog circuitry. Due to PZ-doublet errors, the slow settling time response of an input step function to an analog circuitry make it impractical to use in applications such as a digital oscilloscope. Mitigating the PZ-doublet errors in the frequency domain is not practical due to the problem of the generation of low frequency sinusoidal tones. The solution disclosed in the present invention is to apply a step function and examine the output's slow settling error waveform. A signal is input to an analog to digital converter, and the output of the converter is processed by a computation that produces calibration codes. Calibration codes are coupled to a SC circuitry to mitigate the PZ-doublet errors. The error waveform is then minimized within a specified accuracy.

20 Claims, 15 Drawing Sheets

(56) References Cited

U.S. PATENT DOCUMENTS

| | | | | |
|---|---|---|---|---|
| 2019/0356326 A1* | 11/2019 | Liu | .................... | H03M 1/0607 |
| 2021/0203349 A1* | 7/2021 | Chung | ................. | H03M 1/468 |
| 2021/0218409 A1* | 7/2021 | Ho | ....................... | H03M 1/804 |
| 2022/0407530 A1* | 12/2022 | Strandvik | ........... | H03M 1/0626 |

* cited by examiner

Step Response with PZ doublet

$$H(S) = \frac{(1+\frac{S}{\omega_Z})}{(1+\frac{S}{\omega_p})(1+\frac{S}{\omega_{3dB}})}$$

Step Response $v(t) \cong 1 - e^{-\omega_{3dB} t} - \underbrace{\frac{\Delta\omega}{\omega_Z} e^{-\omega_p t}}_{\text{Slow settling component}}$ $\Delta\omega = \omega_z - \omega_p$ $\omega_{3dB}$ = 3-dB cut of frequency

FIG. 5

SWITCHED CAPACITOR CIRCUITRY FOR MITIGATING POLE-ZERO DOUBLET ERRORS IN AN ANALOG CIRCUIT

TECHNICAL FIELD

Examples of the present disclosure generally relate to switched capacitor subsystems, and in particular, to a switched capacitor circuitry for mitigating pole-zero (PZ) doublet errors in an analog circuitry such as an amplifier.

BACKGROUND

Switched capacitor (SC) biasing is widely used in Class-AB amplifier topologies and other types of analog circuitry, due to the various advantages it provides. The analog circuitry can be any circuitry using a class A/AB structure with negative feedback, or using a SC biasing scheme for signal conditioning, where the SC biasing connected in the signal path is affected by PZ doublet issues.

Examples of such analog circuitry include data converter front end circuits. On the analog to digital converter (ADC) side, an example of analog circuitry might include a LNA/buffer, and on the digital to analog (DAC) side, an example might include an output driver using a class AB/A structure. Some of these advantages are good isolation between a signal and a biasing circuitry and relative ease of implementation, as only switches and capacitors are required to implement the switched capacitor circuitry. SC biasing causes neither offset nor flicker noise in comparison to a continuous time counter-part, since SC biasing uses only passive elements such as switches and capacitors.

Despite the advantages of SC biasing circuitry, SC biasing circuitry in analog circuitry commonly causes a type of signal error or signal distortion known as pole-zero (PZ) doublet errors. These PZ-doublet errors appear as "settling components" in the analog circuitry. A PZ-doublet error appears as a step-in the frequency domain response and a low frequency PZ-doublet error will introduce slow settling time constants. These are problematic issues for many high precision systems such as test and measurement devices (for example, oscilloscopes, spectrum analyzers) and certain communication transceivers. Removal of the PZ-doublet errors is thus necessary in all these cases.

Amplifier circuity coupled to an analog to digital converter (ADC) is a standard configuration in the signal processing chain used everywhere in almost all communication systems or in other applications. The disclosure here adds additional logic circuitry for the digital part of the SC calibration, and also analog circuitry, i.e. the capacitor array for trims in the SC biasing scheme. The objective is to mitigate PZ doublet errors created by the SC biasing scheme, with the use of an already existing ADC in the signal chain.

SUMMARY

A switched capacitor (SC) pole-zero (PZ) doublet error mitigation system is disclosed.

A signal is input into an amplifier or other analog circuitry input node. Switched capacitor biasing circuitry are coupled to one or more amplifier control devices or analog control devices, such as transistors. The SC circuitry can create undesirable PZ-doublet errors in the amplifier circuitry. The output node of the amplifier or analog circuitry is coupled to analog to digital converter (ADC) circuitry. Logic circuitry is coupled to the ADC output data that computes switched capacitor circuitry error mitigation codes (i.e. SC calibration codes).

As described herein, a step function, such as a square wave, is applied to the analog circuitry input, resulting in a slow settling error waveform in the analog circuitry output. The slow settling error waveform in the analog circuitry output is measured. The error waveform is then reduced within a specified accuracy using logic circuitry that computes a series of error mitigation codes in the form of calibration trim bits. The error mitigation codes calibrate the SC circuitry to mitigate the PZ-doublet errors generated in the SC circuitry.

"Mitigating" the PZ-doublet errors may comprise cancelling, or minimizing, or reducing the PZ-doublet errors.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 5 illustrates, according to one example, a mathematical description of the step response of an analog circuitry with a pole-zero doublet signal error.

FIG. 8 illustrates solution equations for mitigating the PZ-doublet error.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
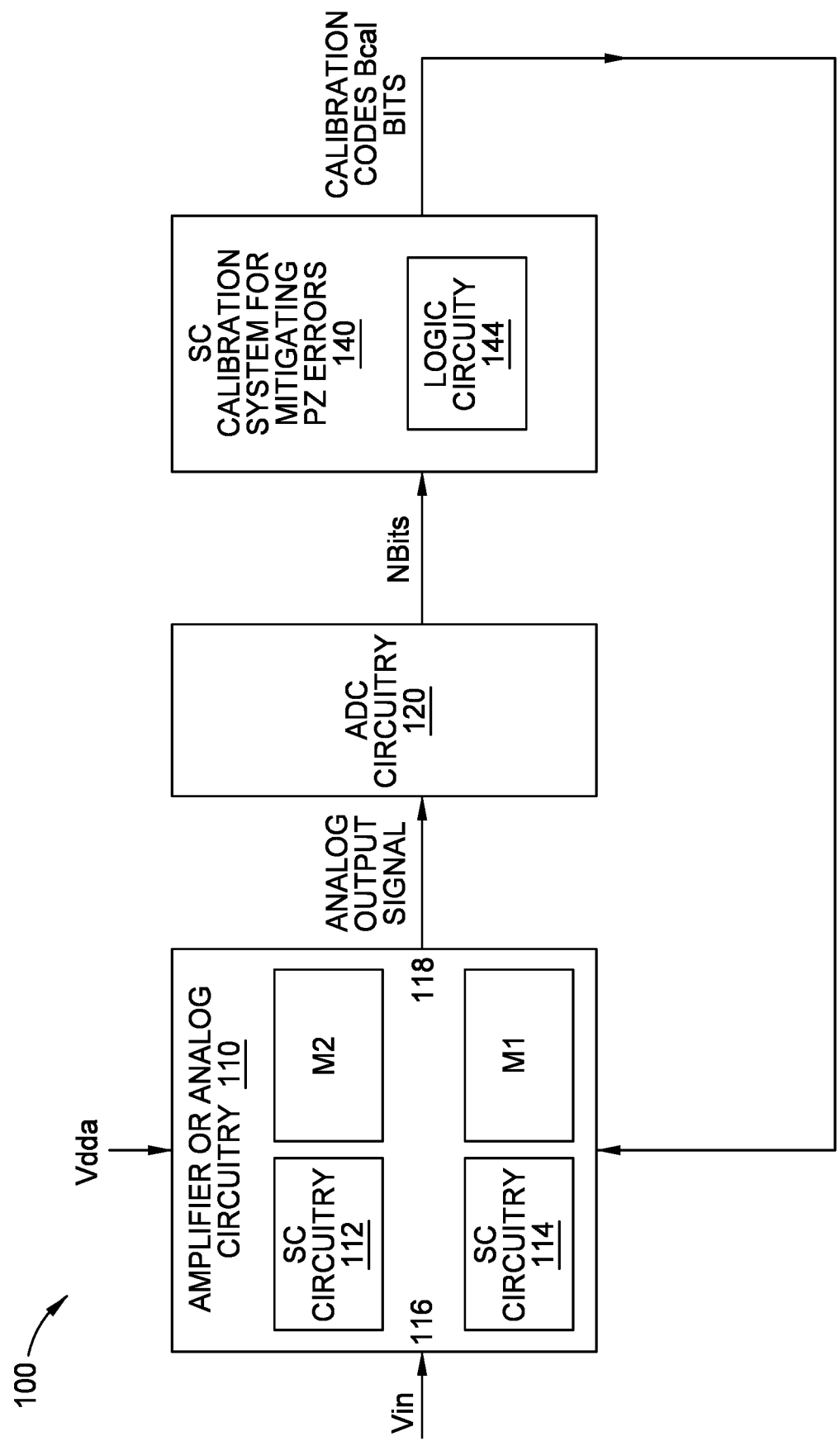
FIG. 1 illustrates, according to one example, a switched capacitor (SC) pole-zero (PZ) doublet error mitigation system block diagram.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

The following are detailed descriptions of a switched capacitor (SC) Circuitry Error Mitigation System for mitigating the pole zero (PZ) doublet errors that occur in analog circuitry such as amplifier circuitry.

Amplifier circuitry connected to an analog to digital converter (ADC) is a standard configuration within the signal processing chains used in almost all communication systems or in other applications. The disclosure here includes logic circuitry (for the digital part of the calibration) and analog circuitry (i.e. the capacitor array for the trims in the switch cap biasing scheme) to mitigate the PZ doublet errors created by a switched capacitor biasing scheme.

As a result of the slow settling time response of an input step function, due to the PZ-doublet error, the input step function becomes impractical to use in applications such as a digital oscilloscope.

Figure 3:
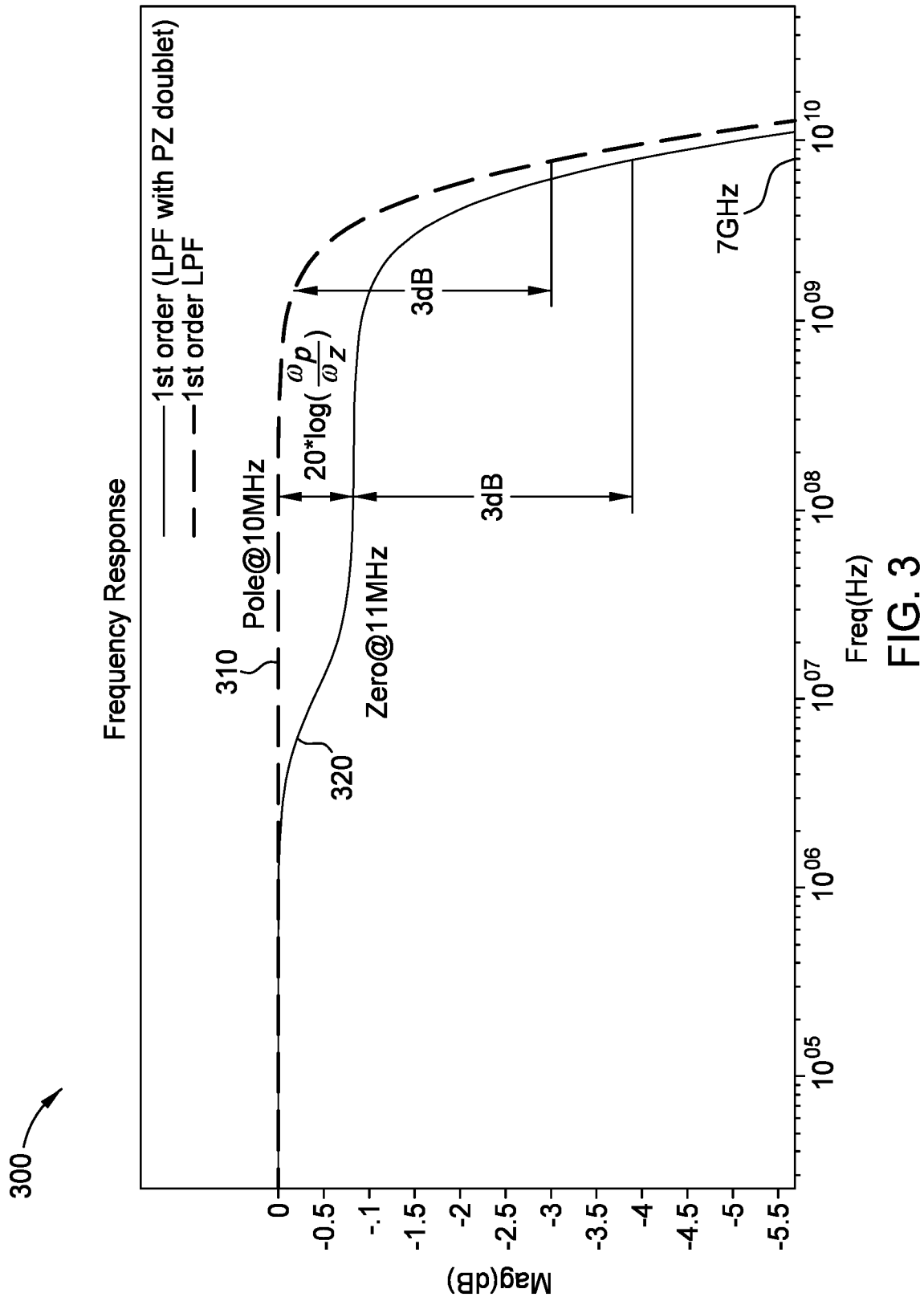
FIG. 3 illustrates, according to one example, frequency responses of an analog circuitry with and without PZ-doublet errors.

The PZ doublet error in the frequency response creates a step in the gain curve (FIG. 3). By applying low frequency tones, for example 1 MHz and 100 MHz tones to the circuit, and then examining the gain (possibly by using an ADC) seen by these tones, one can measure the amount of step present in the frequency domain. These tones must be applied to the input of a circuit, for example, an amplifier, in order to measure the step present. To do so, these pure sinusoidal tones need to be generated inside a chip, which is simply not possible/feasible in almost all systems. Mitigating the PZ-doublet errors in the frequency domain is not practical due to the problem of the generation of low frequency sinusoidal tones.

As described herein, a step function, such as a square wave, is applied to the analog circuitry input, resulting in a slow settling error waveform in the analog circuitry output. The error waveform is then mitigated (e.g., minimized, or reduced within a specified accuracy) with the use of logic circuitry that cycles through a series of calibration trim bits that are applied to the SC circuitry.

An analog input signal is connected to an analog to digital converter (ADC) circuitry. The ADC output data is processed by logic circuitry that produces error mitigation codes (i.e. calibration codes) comprising calibration trim bits (i.e. bcal bits). The calibration codes are coupled to the SC circuitry to mitigate the PZ-doublet errors.

Figure 4:
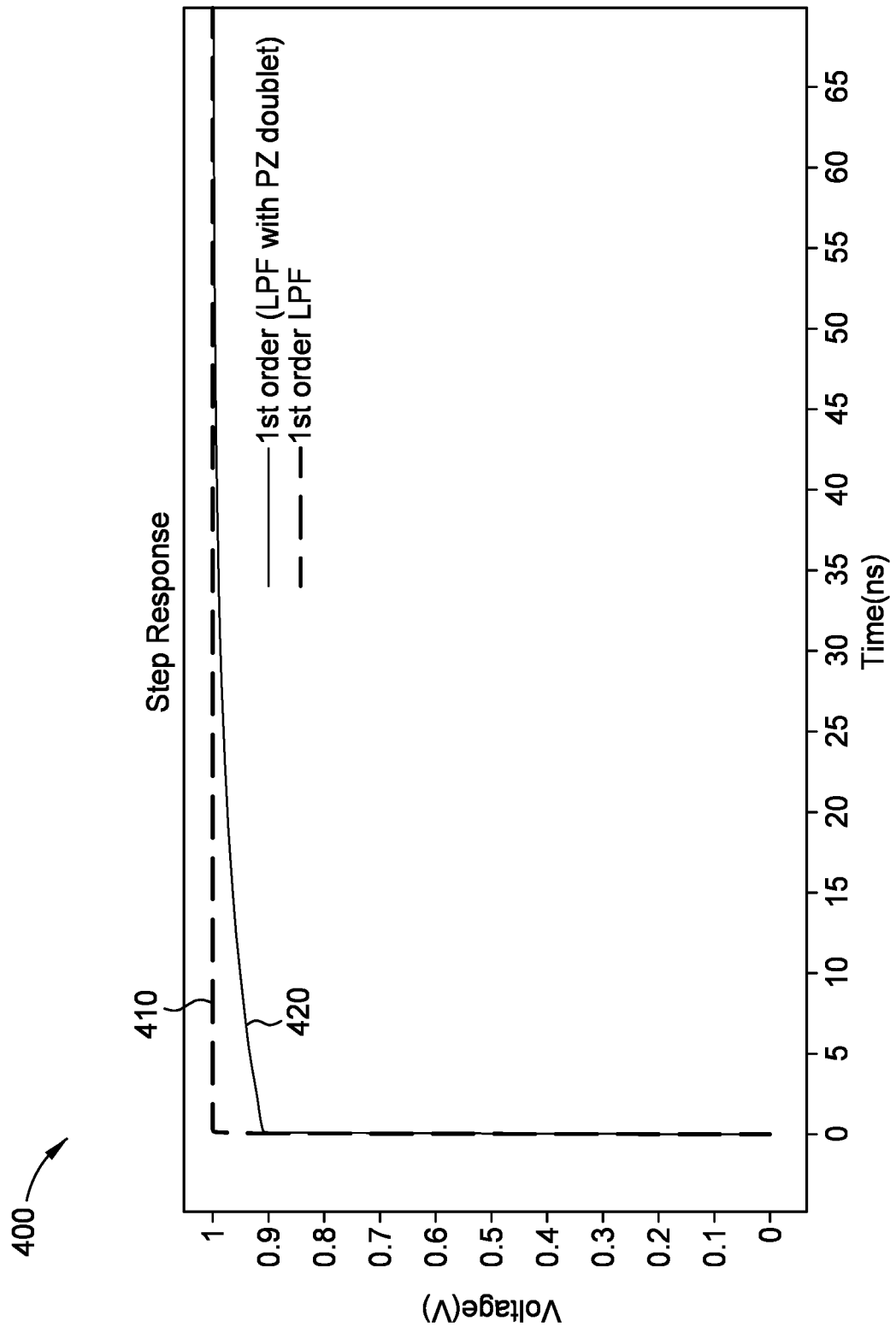
FIG. 4 illustrates, according to one example, step responses of an analog circuitry with and without PZ-doublet errors.

FIG. 1 depicts a block diagram of a switched capacitor (SC) circuitry error mitigation system 100 to mitigate PZ-doublet errors, as depicted in FIGS. 3-4, according to one example.

A switched capacitor (SC) circuitry error mitigation system 100 includes an amplifier, amplifier inverter, or other analog circuitry 110. The analog circuitry 110 includes one or more amplifiers M1, M2 that are connected to several SC circuitry 112, 114. Analog signals are fed into the analog input 116 of the amplifier circuitry 110.

The amplifier or analog circuitry 110 includes an analog output 118. The analog output 118 is coupled to analog to digital converter (ADC) circuitry 120 that samples the analog signal and produces N digital output bits that represent the analog signal in digital data form.

The SC circuitry error mitigation system 100 also includes a SC calibration system 140 containing logic circuitry 144 to compute SC calibration codes containing Bcal bits that calibrate the SC circuitry 112,114, so as to mitigate PZ-doublet errors produced in the amplifier circuitry 110. In some examples of the invention, the logic circuitry may comprise digital logic gates. In other examples of the invention, the logic circuitry may comprise microprocessors, microcontrollers, or field programmable gate arrays.

The SC calibration codes and the process of generating them will be described in greater detail in the following figures.

After the SC calibration codes are computed by the SC calibration system 140, they are then transmitted to the SC circuitry 112,114 to configure resistance values of the SC circuitry 112,114. The calibrated SC 112,114 circuitry then mitigates (or removes) the PZ-doublet errors in the SC amplifier or analog circuitry.

Figure 2:
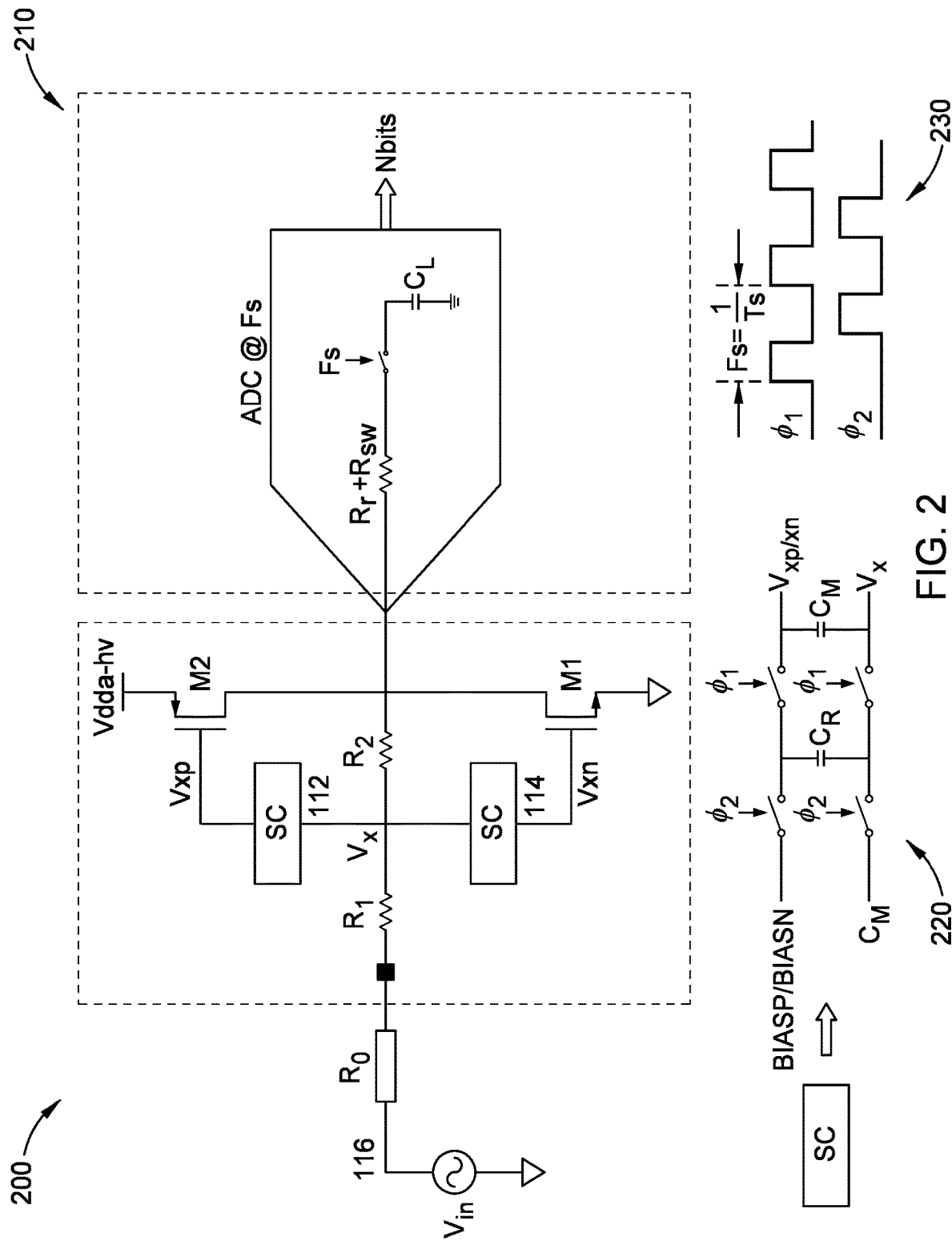
FIG. 2 illustrates, according to one example, analog circuitry using switched capacitor biasing.

FIG. 2 illustrates details of one example of the analog circuitry 110 shown in FIG. 1. In FIG. 2, the amplifier circuitry 200 uses a SC biasing scheme in the SC circuitry, also shown in FIG. 1 as the SC circuitry 112,114.

Vdda_hv is the power supply. $R_0$ is the port impedance associate with $V_{in}$. $R_1$ is the input resistance connected to the amplifier input node (FIG. 1, 116). $R_2$ is the feedback resistance. The amplifiers M1 and M2 are implemented in this example as NMOS/PMOS transistors of the amplifier circuitry 200 providing transconductance. These transistors both include drain nodes, control gates or control inputs, and source nodes. The SC-CAP circuitry connects to $R_1$ and provides biasing voltages $V_{xp}$ and $V_{xn}$ to the control gates of the amplifiers M1 and M2.

At an analog output, the amplifier output is sampled by ADC circuitry 210, (FIG. 1, 120) running at sampling frequency Fs. In the resistor $R_r+R_{sw}$, $R_r$ represents the routing resistance, i.e. the interconnect metal routing resistance from the buffer to the ADC. $R_{sw}$ is the switch resistance of the ADC sampling switch. The ADC circuitry 210 produces N bit ADC output data.

One example implementation of the SC circuitry is shown in detail at 220. Clock waveforms are generally present in all mixed signal systems, such as ADCs, DACs, FPGAs, etc. The SC circuitry 220 is implemented using passive switches driven by the $^{SM}1$ and $\phi_2$ clock waveforms 230 running at appropriate voltage levels for the switches. The $\phi_1$ and $\phi_2$ clock waveforms 230 are non-overlapping as shown in FIG. 2, with a frequency typically equal to the ADC sampling frequency.

The capacitors $C_R$ and $C_M$ are the Refreshing and Main capacitors respectively. The $C_M$ (larger) capacitor delivers the main signal to the gates of transistors M1 and M2, and it also delivers bias voltage. The $C_R$ capacitor initially dumps the bias charge onto $C_M$. Once $C_M$ has received enough bias voltage across it, $C_R$ provides only the maintenance charge for any leakage associated with $C_M$. This charge dumping from $C_R$ to $C_M$ occurs at the clock rate, so the larger the $C_R$ and/or the larger the clock rate, the faster $C_M$ acquires the bias voltage across it, so that in other words the startup settling time will be lower. In some examples, the capacitance value ratio $C_M/C_R$ will typically be very large (>20), but a small $C_R$ is preferred depending on the start up settling requirement. BIASP and BIASN are the bias voltages corresponding to M2 and M1. $C_M$ is the common mode voltage at the output of the amplifier, which is the same at $V_x$ also. Under steady state conditions, $V_{xp}$ and $V_{xn}$ will be BIASP and BIASN respectively.

FIG. 3 illustrates a chart 300 showing the frequency response of an amplifier or other analog circuitry, such as FIG. 2, 200, without the pole-zero (PZ) doublet error 310, and a frequency response with the stepped PZ-doublet error 320.

A low frequency PZ-doublet error is formed in the SC circuitry (FIG. 2, SC CAP) due to the difference in DC loop gain and a slightly high frequency loop gain. The PZ-doublet error is created in the step (i.e. decrease) in the input to output transfer function in the frequency domain.

A communication system usually includes a transmitter, which includes a modulator, and a receiver that includes a demodulator. In Narrow Band wireless applications, this step in frequency transfer characteristic introduced by the PZ-doublet error is undesirable, mainly due to the gain flatness specification derived from the EVM (error vector magnitude) requirement of the demodulator.

FIG. 4 illustrates a chart 400 showing the time domain step response of an amplifier or other analog circuitry (such as FIG. 2, 200), without the PZ-doublet error 410, and a stepped response with the PZ-doublet error 420.

In the time domain, the PZ-doublet error creates a slow settling component, corresponding to the PZ frequency, in the SC circuitry, even if the overall 3 dB-bandwidth is pretty high.

FIG. 5 illustrates a mathematical description 500 of the step response of an amplifier or other analog circuitry with a PZ-doublet error.

To provide a basic description of the step response, assume an amplifier system with a PZ-doublet error at 10 MHz-11 MHz. The amplifier system has $\omega 3$ dB=7 GHz. H(s) is the LaPlace transfer function, i.e. the frequency domain function of the system. The slow settling component (as illustrated in FIGS. 3-4) has an error amplitude of 1/11=0.09V for a 1V step input at the input, with a time constant of 16 ns, i.e. $1/(2*\pi*10M)$. That is roughly a 3 bit settling error, which is not acceptable in an oscilloscope type time domain application. In the frequency domain, that is roughly 0.83 dB in 1 MHz. This can affect the performance of a narrow band demodulator, and the error also creates a false output for a spectrum analyzer. In the absence of this PZ-doublet error, the amplifier system would have settled with a time constant of 23 ps, i.e. $1/(2*\pi*7G)$, which is an extremely fast settling time with respect to the input step rise time.

Figure 6:
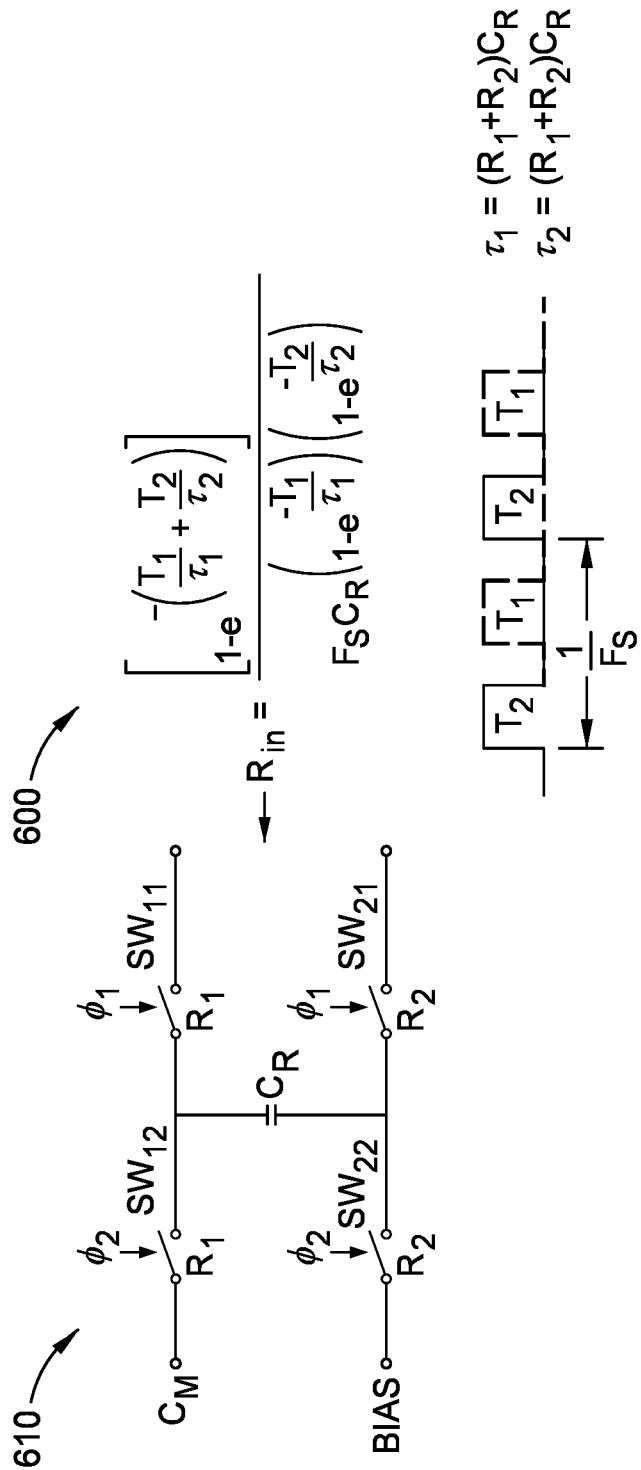
FIG. 6 illustrates, according to one example, switched capacitor impedance modeling for SC circuitry producing a PZ-doublet error.

FIG. 6 illustrates switched capacitor impedance modeling 600 for SC circuitry producing a PZ-doublet error. FIGS. 1-2 contain examples of such SC circuitry.

A model 610 of SC switches that produce the resistance $R_{in}$ is shown in FIG. 6. $T_1$ and $T_2$ are the on times of the SC switches $SW_{11}$ and $SW_{21}$, and $SW_{12}$ and $SW_{22}$. $R_{in}$ is the real component of the SC circuitry, which is only valid near low frequencies much smaller than sampling frequency $F_S$. In our examples, the PZ-doublet error occurs at low frequencies, so the analysis of $R_{in}$ here holds true.

Figure 7:
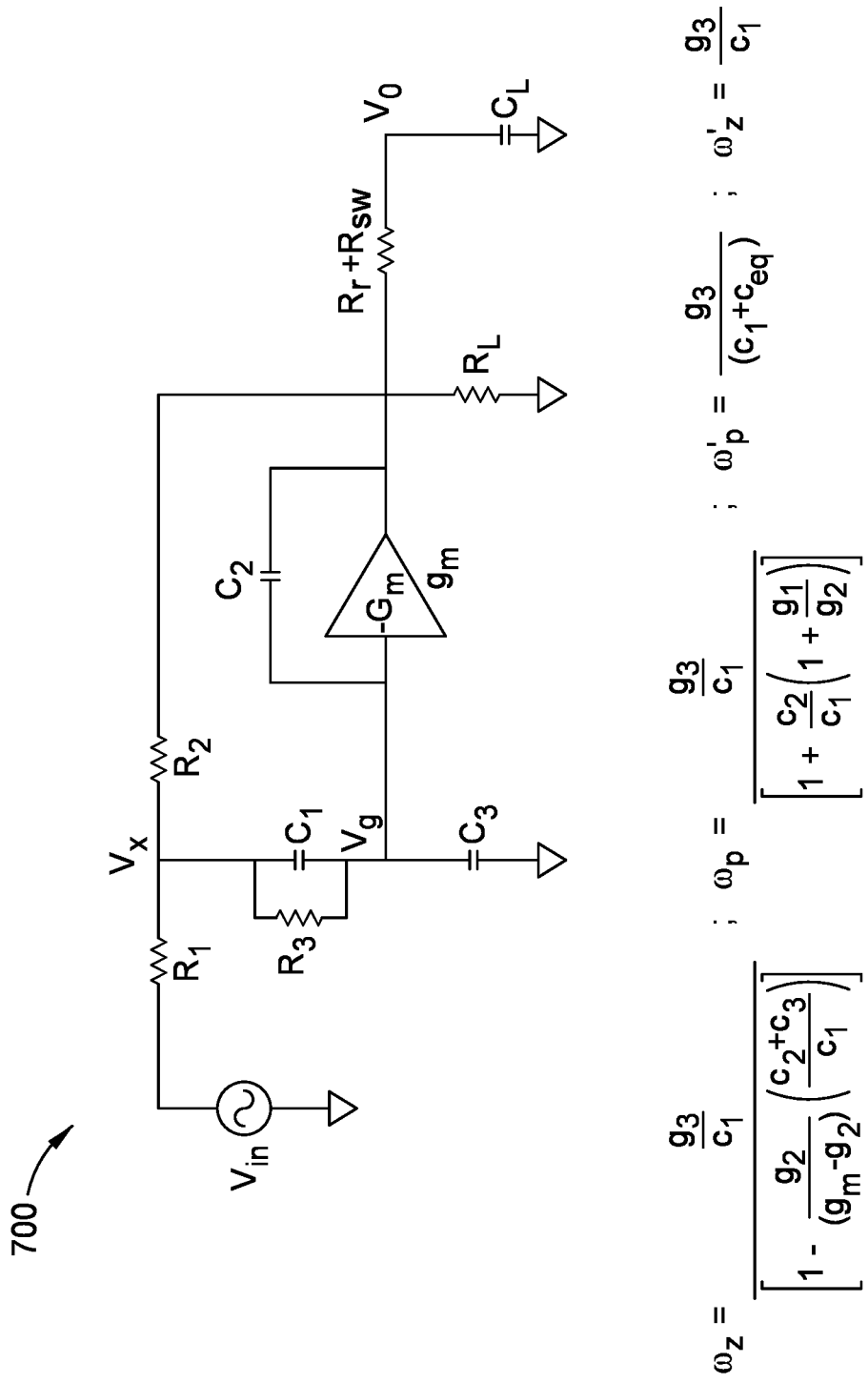
FIG. 7 illustrates, according to one example, a model of the PZ-doublet errors in the circuitry of FIG. 2.

FIG. 7 illustrates a model 700 of the PZ-doublet errors in the SC circuitry of FIG. 2.

Figure 8:
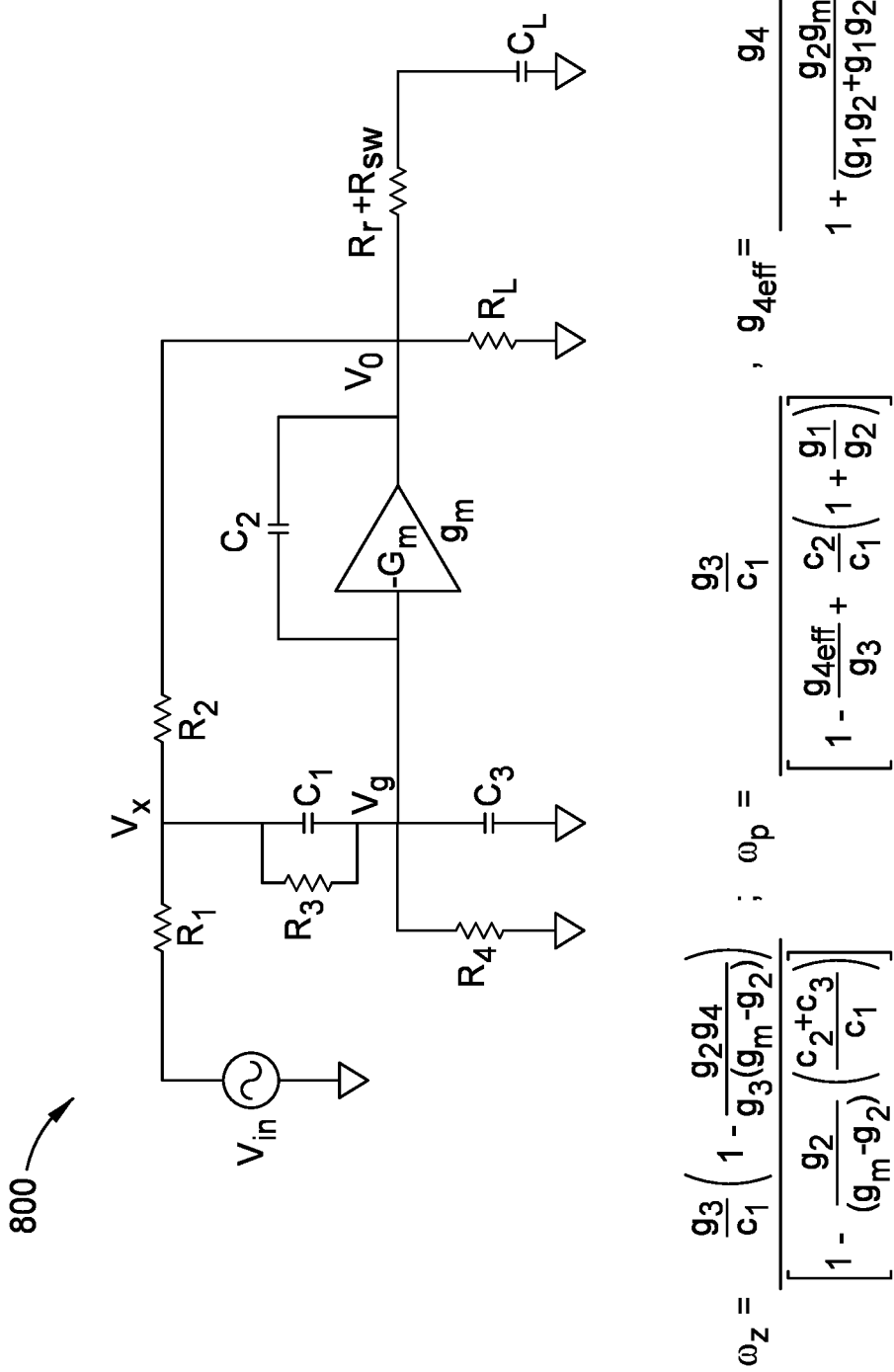
FIG. 8 illustrates, according to one example.
Figure 9:
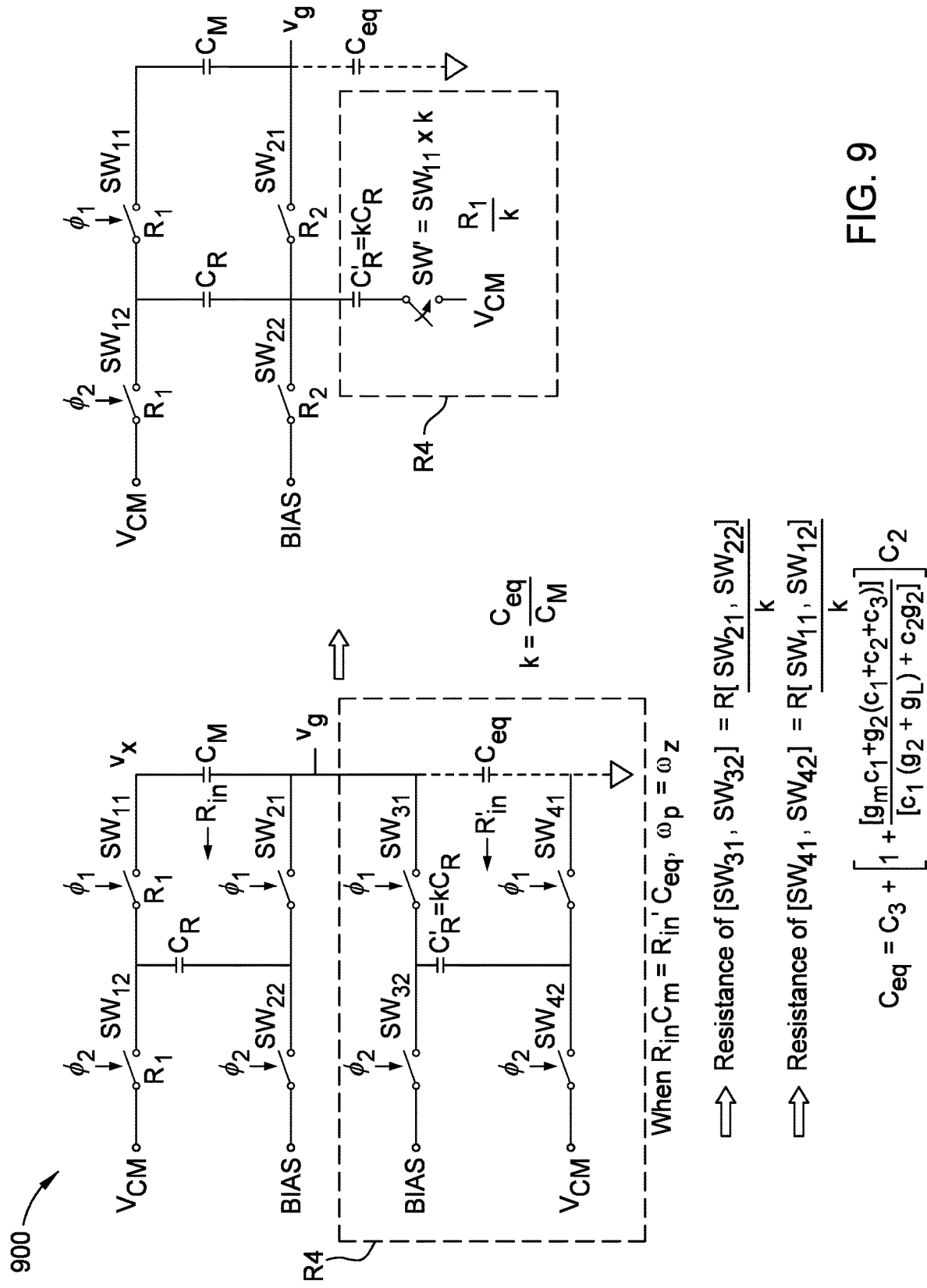
FIG. 9 illustrates, according to one example, the implementation of resistor $R_4$ in a SC biasing circuitry.

$R_{in}$ in FIG. 6 is shown as $R_3$ in FIG. 7 and FIG. 8. The pole value $\omega_p$ and zero value $\omega_z$ are the approximate pole zero locations of the doublet. $R_1$ includes both input and port resistance. In one example displayed in FIG. 2, $R_0$=50 ohms and $R_1$=50 ohms. $R_0$ (FIG. 2) is the external standard port impedance associated with the input applied to the circuitry under consideration. $R_1$ is the impedance present inside the circuitry that generally matches with $R_0$. These are standard configurations, especially in RF (radio frequency) designs. $R_3$ is the SC equivalent resistance at low frequency but $R_3$ is still valid within the PZ location. The presence of $R_3$ creates a PZ doublet error that will be mitigated using $R_4$. $R_4$ is shown in FIGS. 8-9. $G_m$ is the overall transconductance of the inverter transistors (i.e., the sum of the NMOS and PMOS transconductance). The value of $C_1$ is the level shifting capacitor (i.e. the sum of $C_M$ from the NMOS and PMOS path). $C_{GD}$ is the capacitance (gate to drain) associated with an MOS transistor. The value of $C_2$ is the sum of the $C_{GD}$ and the layout parasitic between the gate and the drain of both the NMOS and the PMOS devices. The value of $C_3$ is the sum of gate to source capacitance of the NMOS and PMOS devices. $C_L$ is the load capacitance that includes all capacitance, with the main contributor being the ADC sampling capacitor. In the resistor $R_r+R_{sw}$, $R_r$ represents the routing resistance, i.e. the interconnect metal routing resistance from the buffer to the ADC. $R_{sw}$ is the switch resistance of the ADC sampling switch. $R_L$ is modelled as the effective rout (routp||routn) of the NMOS and PMOS devices together.

The open loop low frequency and pole and zero are sufficiently separated. For example, assume that the equivalent capacitance at node $V_g$ is $C_{eq}$ (in FIG. 9). As a result, the open loop low frequency pole ($\omega'_p$) is $g_3/(C_1+C_{eq})$ and the low frequency zero ($\omega'_z$) is $g_3/C_1$. The value of $C_{eq}$ will be similar to $C_1$, due to the Miller effect of the inverter. This means that the open loop low frequency pole and zero ($\omega'_p$ and $\omega'_z$) can be twice as far apart. But due to the negative feedback loop gain, the closed loop low frequency pole ($\omega_p$) and zero ($\omega_z$) form a PZ doublet. A PZ doublet is the name associated with a pair known as pole and zero that are adjacent to each other. The presence of PZ doublets are undesirable in any circuit as they create the errors mentioned above that the invention mitigates by removing the PZ doublet altogether. When the pole and zero are equalized, they disappear, similar to how positive and negative charges collide and neutralize each other.

FIG. 8 illustrates solution equations 800 for calculating the added resistance $R_4$ necessary for mitigating the PZ-doublet. The introduction of the proper value for $R_4$ into the circuitry causes $\omega_z$ and $\omega_p$ to be equal, thus mitigating the PZ-doublet. The term $g_4$ in $\omega_z$ moves $\omega_z$ towards DC, as it forces $\omega_p$ to move away from DC. When $\omega_z$ and $\omega_p$ are equated, $g_4$ can be solved for, thereby achieving (in theory) a perfect mitigation of the pole and the zero. However, in practice due to variations in the manufacturing process, and due to variations in temperature (environment) and voltage (power supply), perfect mitigation of the pole and the zero error components will probably not be achieved.

In FIG. 8, $g_4$ and $g_L$ are $1/R_4$ and $1/R_L$ respectively. $G_1$, $g_2$, and $g_3$ are $1/R_1$, $1/R_2$, and $1/R_3$ respectively. $R_4$ is the added resistance configured to mitigate the PZ-doublet. $R_4$ is equivalent to $R_3$ in other figures. In the resistor $R_r+R_{sw}$, $R_r$ represents the routing resistance, i.e. the interconnect metal routing resistance from the buffer to the ADC. $R_{sw}$ is the switch resistance of the ADC sampling switch.

FIG. 9 illustrates the implementation of resistor $R_4$ in FIG. 8 that represents the added correction resistance configured to mitigate the PZ-doublet error in a SC error mitigation biasing circuitry 900. In some examples, the left side implementation of $R_4$ can be simplified to the right side implementation of $R_4$. Either implementation is possible, depending on the example of the invention.

$V_g$ is the gate node corresponding to the PMOS and NMOS devices. $V_x$ is the virtual ground. The term $C_{eq}$ expresses the Miller effect of the $G_m$ inverter amplifier multiplied by $C_2$. In this way, the PZ-doublet error mitigation can work across sampling frequency $F_s$.

Figure 10:
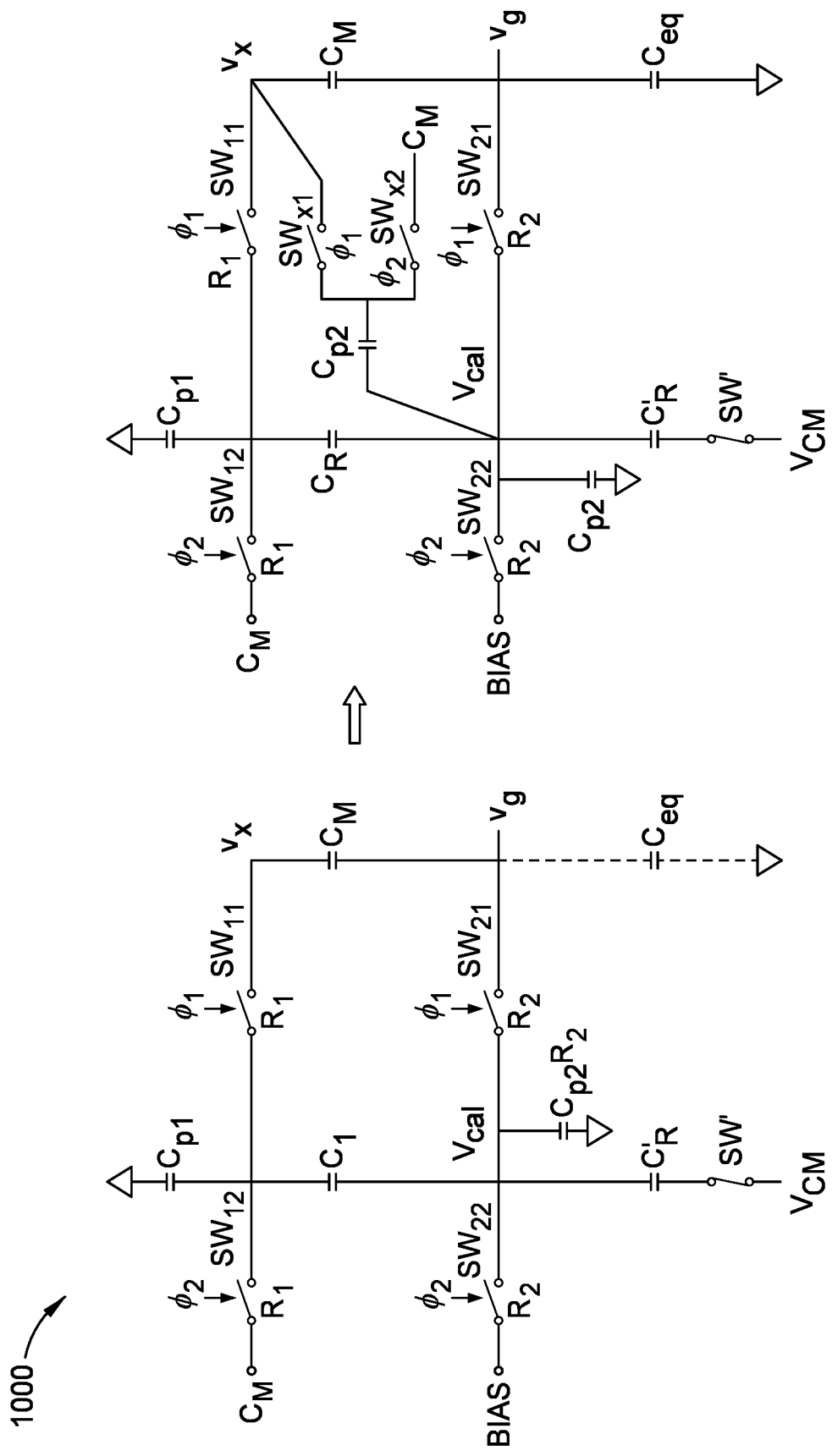
FIG. 10 illustrates, according to one example, parasitic capacitor circuitry.

FIG. 10 illustrates parasitic capacitor circuitry 1000.

Vcal is the node name where the correction resistor (FIG. 9, $R_4$) is added.

In this embodiment, SW' is an always ON switch identical to $SW_{11}/SW_{12}$ connected to $C_M$.

The presence of parasitic capacitors $C_{p1}$ and $C_{p2}$ changes the impedance of the SC circuitry significantly. SW' is intended to be a permanently on switch. $C_{p2}$ can be compensated as shown in the right side of the figure. The resistance of switches $SW_{x1}$ and $SW_{x2}$ have to be much smaller compared to the resistances of $SW_{21}$, $SW_{22}$. Mitigating $C_{p1}$ is quite difficult. In addition, $C_M$ can contain a Metal-Oxide-Metal capacitor which will have a different variation with $C_{eq}$ as $C_{eq}$ is process and temperature dependent. So the overall mitigation of the parasitic capacitors across sampling frequency $F_s$ and PVT is not practical.

Figure 11:
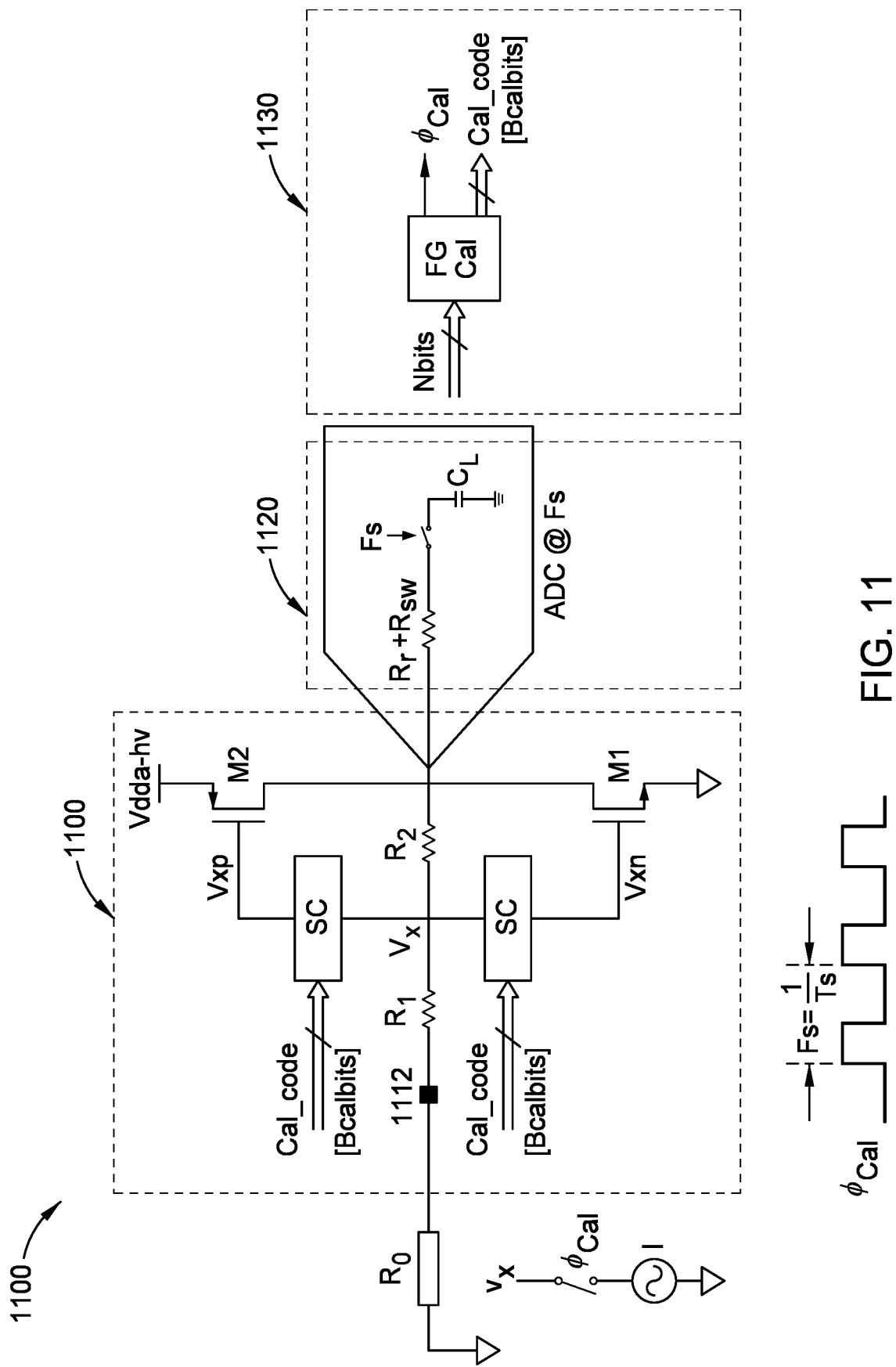
FIG. 11 illustrates, according to one example, a PZ-doublet error mitigation system.

FIG. 11 illustrates a PZ-doublet error mitigation system 1100.

Details of the amplifier circuitry 1110 are shown. The amplifier circuitry 1110 (also shown in FIG. 1, 110 and FIG. 2, 200) uses switched capacitor biasing in the SC circuitry.

In the amplifier circuitry 1110, $V_{dda\_hv}$ is the power supply voltage. $R_0$ is the port impedance of the driver $V_{in}$. $R_1$ is the input resistance connected to the amplifier input node 1112. $R_2$ is the feedback resistance. In the resistor $R_r+R_{sw}$, $R_r$ represents the routing resistance, i.e. the interconnect metal routing resistance from the buffer to the ADC. $R_{sw}$ is the switch resistance of the ADC sampling switch. M1 and M2 are the NMOS/PMOS transistors of the amplifier providing transconductance. These transistors both include drain nodes, control gates or control inputs, and source nodes.

At an analog output, the amplifier output is sampled by an ADC 1120 running at sampling frequency $F_S$. The ADC 1120 produces N bit ADC output data. The N bit ADC output data is processed by the SC calibration circuitry 1130, shown as FIG. 1, 140, performing a method (FIGS. 14-15) to produce the Cal-code (calibration code) that mitigate the SC PZ doublet errors.

The Cal-code is a digital word of a user defined number of bits (Bcal bits). Any number of bits can be used, depending on the calibration accuracy desired by the user. The greater the number of Bcal bits used, the higher will be the accuracy of the calibration circuitry.

Mitigating the PZ-doublet errors by applying single tones at frequencies near the PZ-doublet, and then estimating the PZ locations from the amplitude obtained, is not practical in most systems. This is due to factors such as the generation and implementation of low frequency sinusoidal tones.

The methods described herein include applying a step function, then measuring the ADC output data that contains a slow settling error waveform resulting from a PZ-doublet error in the SC circuitry. The PZ-doublet error waveform is then minimized or reduced within a specified accuracy by the calibration codes computed in the logic circuitry.

The calibration method requires a step input at the virtual ground. Since it is a virtual ground, it will be a low impedance node, meaning that only a current source can be applied to a virtual ground of an amplifier. This current source I will flow through the feedback resistor $R_2$ generating a voltage waveform at the output of the amplifier/analog circuitry. So, if a step current is applied at the virtual ground, it is equivalent to applying a step voltage at the input port of the amplifier (the input of resistor $R_1$). This generates a step voltage waveform with a PZ doublet error at the output of the amplifier.

The current injection I at the virtual ground can be accomplished by several methods, such as using a resistor based method or a current source based method.

Figure 12:
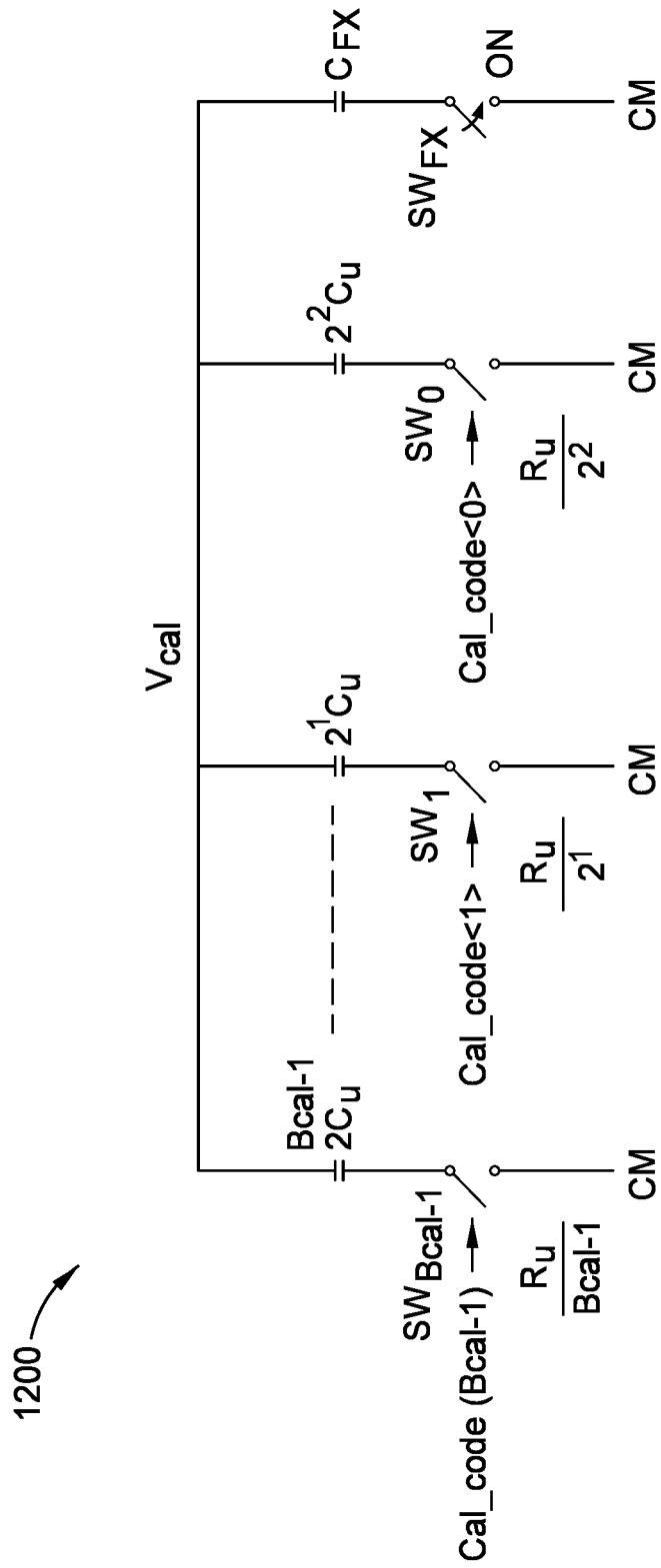
FIG. 12 illustrates, according to one example, calibration trim leg circuitry.

FIG. 12 illustrates calibration trim leg circuitry 1200, i.e. multiple SC circuitry paths, each one being configured by one Bcal trim bit that turns one SC circuitry path on or off. The PZ-doublet error is minimized by cycling through the Bcal trim bits.

Vcal is the node name where the correction resistor (FIG. 9, $R_4$) is added. Ru is the Unit resistance. Cu is the Unit capacitance associated with Ru. $C_{FX}$ is the fixed capacitance that is not part of the trim process (i.e. the Foreground calibration). $Ru \times Cu = C_{FX} \times R_{SWFX}$. These numbers basically represent the time constants in each trim leg in FIG. 12. They are equal to each other and also equal to the right most trimleg (the fixed branch) in FIG. 12.

The $C_M$ capacitor delivers the main signal to the transistors or amplifier devices. CM is the common mode voltage at the output of the amplifier.

The SC circuitry can be loaded and trimmed with a binary weighted cap as shown in the figure, along with an always on leg. The switch sizes (resistance) can be configured as in FIG. 9.

Figure 13:
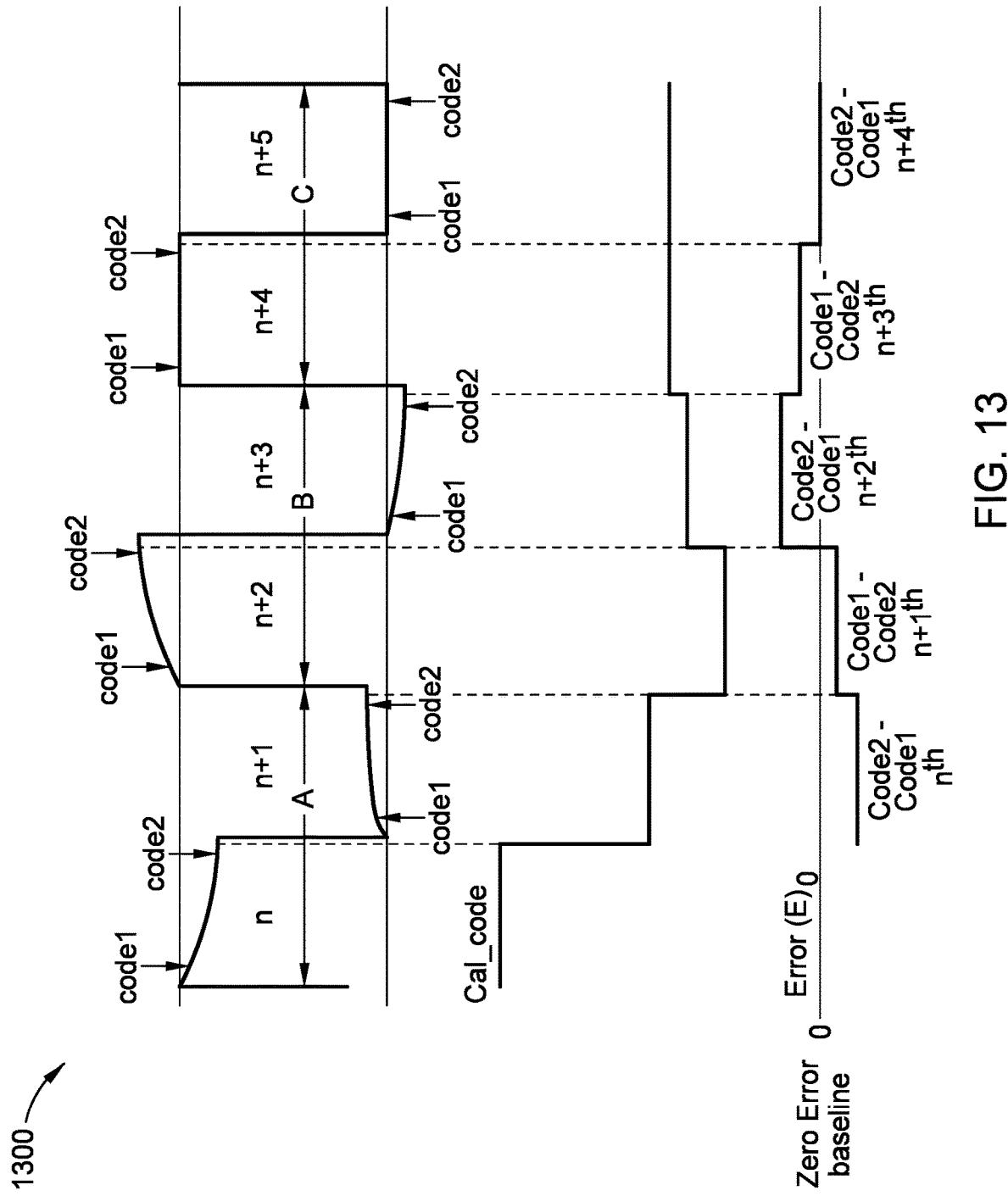
FIG. 13 illustrates, according to one example, PZ doublet error waveforms with calibration codes.

FIG. 13 illustrates PZ-doublet error waveforms 1300 produced by various calibration codes, in a series of discrete ADC output data points represented by a continuous line in the figure. A square wave has been injected into the SC circuitry, and the desired output of the ADC circuitry are ADC output data samples representing flat square waves input into the analog system, without PZ-doublet errors present in the input.

Code 1, at the beginning of step n is Capacitor division (between $C_M$ and Ceq) dominated. Code 2, at the end of the step, is SC resistance dominated. This results in the voltage division due to $R_3$ and $R_4$ in FIG. 8.

In region A, trim legs exceeding the optimum SC values were utilized so that the output is undershooting the error free level. In region B, trim legs less than the optimum SC values are utilized so that the output is overshooting the error free level.

In region C, the optimum trim leg values are utilized so that the ADC output waveforms are flat, without slow settling or PZ-doublet errors.

A calibration code is calculated based on the maximum error value (E) and an increment is added or subtracted from the current calibration code.

Figure 14:
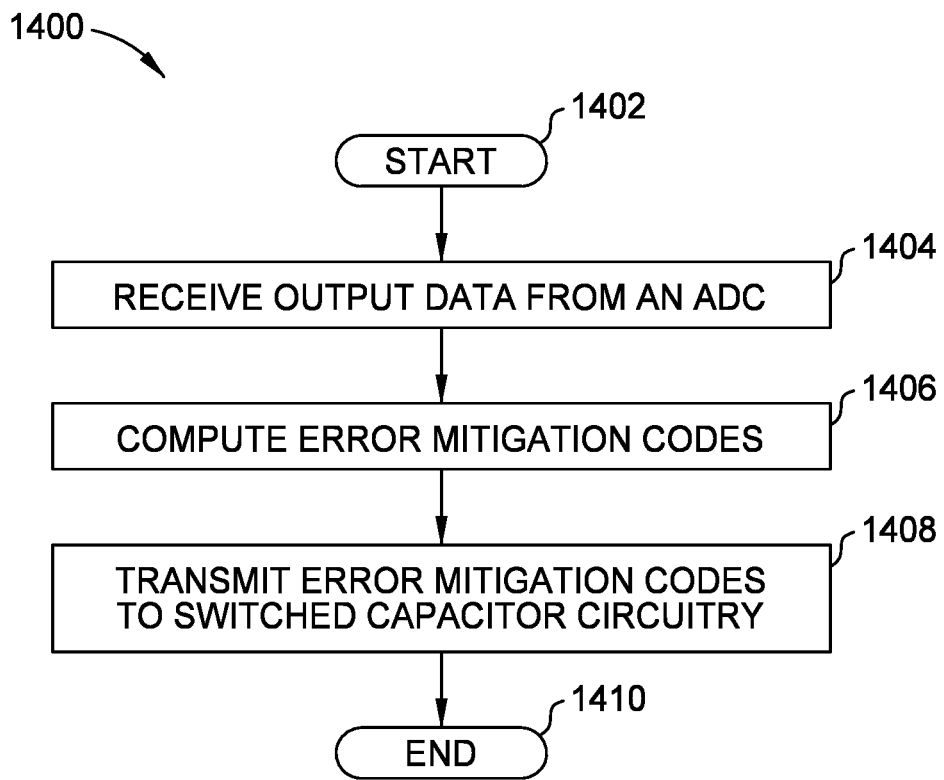
FIG. 14 is a method for mitigating errors in a SC circuitry, according to one example.

FIG. 14 is a method 1400 for mitigating errors in a SC circuitry. Error mitigation codes are computed for performing a switched-capacitor calibration, according to one example. The computations are performed in the SC calibration system 140 in FIG. 1 (e.g., logic circuitry 144).

In step 1402, the method starts. Output data is received from an analog to digital converter (ADC) in step 1404.

In step 1406, error mitigation codes are computed, based on the ADC output data received in step 1404.

In step 1408, the error mitigation codes are transmitted to SC circuitry to calibrate the SC circuitry switches and mitigate PZ doublet errors in the SC circuitry.

The method ends at step 1410.

Figure 15:
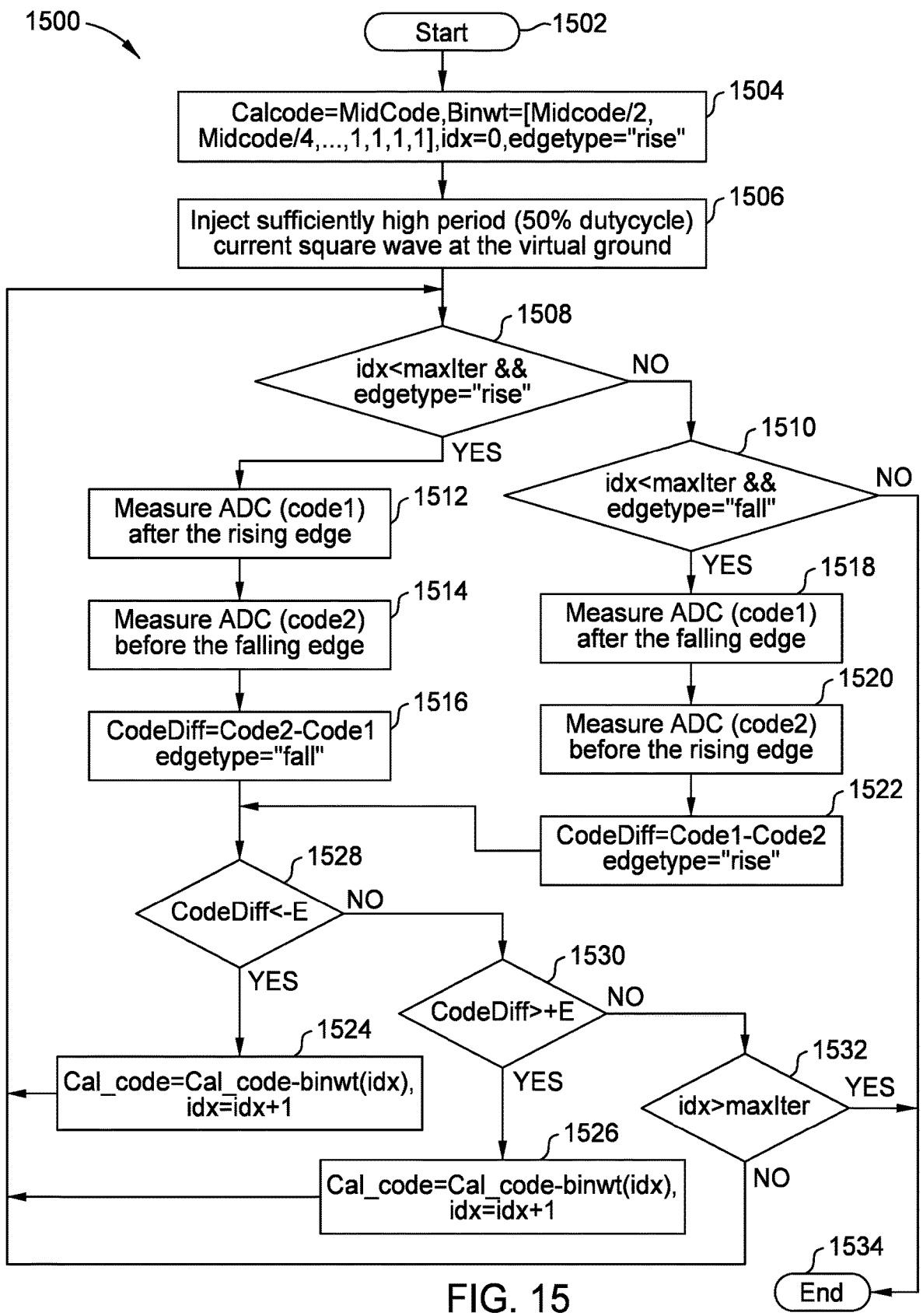
FIG. 15 is a method for mitigating errors in a SC circuitry, according to one example.

FIG. 15 is a method 1500 for mitigating errors in a SC circuitry. Error mitigation codes are computed for performing a SC calibration process, according to one example. The SC calibration process performs repeated search loops including a binary search computation initially, followed by a linear search. The computations are performed in the SC calibration system 140 in FIG. 1 (e.g., logic circuitry 144).

In step 1502, the method starts. In step 1504, the SC calibration system selects the midcode value calibration code used in the method 1500. The method is implementing a binary weighted scheme so that a midcode calibration code corresponds to the MSB being set to 1, while remaining all bits set to 0. As an example for a 7 bit scheme, the midcode=[1000000], numerically equal to $2^6=64$ in base 10.

In step 1506, a high period square wave is inputted into an amplifier circuitry, or other analog type circuitry. The period of the current square wave is chosen so that it is at least 10 times the possible PZ-doublet time constant. But this is not a strict requirement. The SC calibration system effectively measures the slope of the settling wave, and is adjusting the settling wave within an error limit, so that the time spent in the Foreground calibration is small.

Foreground (FG) calibration refers to a calibration performed outside of the normal operation of the system. Once this Foreground calibration process is done, the system will be ready to accept input from the user. During the FG calibration, the user input to the chip should be differentially shorted (with the P-side and the N-side shorted and connected to appropriate common mode voltage), so as not to disturb the calibration process. This fairly easy requirement happens only during the start up or power up of the device.

An example of a Foreground calibration might be most of the modern digital weight measurement equipment. This equipment includes a feature that self-calibrates (Foreground calibration) itself to zero weight and then notifies us that it's ready for a person to stand on it to obtain their weight measurement. If the calibration isn't performed, then the weight measurement will have an error due to the internal assumption of zero weight when no one is standing on the weight measurement equipment.

In steps 1508 and 1510, the SC calibration system selects the maximum iteration value maxIter of the search loop to be sufficiently high to insure that the method 1500 converges once it enters into the linear search region, i.e. if convergence is not achieved in the binary search region, due to any large code changes and possible dynamic errors associated with it.

The maximum error value E in step 1528 can never be reduced to zero due to the resolution limitations of the binary Calcode data range. As the bus width is increased, meaning the range, the error reduces exponentially according to a power of 2. The value of E that is chosen depends on the settling error, i.e. 1 LSB at a 12 bit level for an ADC with a 12 bit resolution.

The SC calibration system can perform the calibration on both high and low levels of the square wave to make it converge faster in less time.

In steps 1512-1520, the SC calibration system calculates the Code Diff, i.e. the computed difference value, multiple times within the search loop iterations, and averages the Code Diff at each Calibration code setting to remove the thermal and flicker noise present in the system.

In step 1532, when the maximum number of iterations in the search loop have been reached, the the SC calibration system finishes at 1534, producing the final Cal-code, i.e. error mitigation code. The final Cal-code will produce a calibration error that represents the final error value.

By increasing the Calibration trim legs with a smaller unit capacitor and averaging the measurement (as described above), a desired amount of accuracy can be achieved.

The techniques described here are not limited to the application in the circuitry described above. The techniques can be applied universally in all types of circuitry.

The techniques described here do not add any power penalty, and the area penalty added is negligible, nor does it change other design parameters such as noise.

The effective SC resistance added is very high, (i.e. Kilo ohms to Mega ohms) compared to input resistor $R_1$.

The techniques described here do not affect linearity as it modifies the very low frequency region of the frequency response where the loop gain is already very good. A change like 1 dB in loop gain is insignificant.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

The methods disclosed herein comprise one or more steps or actions for achieving the methods. The method steps and/or actions may be interchanged with one another. In other words, unless a specific order of steps or actions is specified, the order and/or use of specific steps and/or actions may be modified.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a c c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The previous description is provided to enable any person skilled in the art to practice the various aspects described herein. Various modifications to these aspects will be readily apparent to those skilled in the art, and the generic principles defined herein may be applied to other aspects. Reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The various operations of methods described above may be performed by any suitable means capable of performing the corresponding functions. The means may include various hardware and/or software component(s) and/or module(s), including, but not limited to a circuitry, a digital signal processor (DSP), an application specific integrated circuitry (ASIC), or a processor (e.g., a general purpose or specifically programmed processor). Generally, where there are operations illustrated in figures, those operations may have corresponding counterpart means-plus-function components with similar numbering.

The various illustrative logical blocks, modules and circuitry described in connection with the present disclosure may be implemented or performed with a general purpose processor, a DSP, an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in software, the functions may be stored or transmitted over as one or more instructions or code on a computer readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein, for example, instructions for performing the operations described herein and illustrated in FIGS. 14-15.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

While the foregoing is directed to specific examples, other and further examples may be devised without departing from the basic scope thereof, and the scope thereof is determined by the claims that follow.

What is claimed is:

1. An integrated circuit, comprising:
analog circuitry configured to receive an analog signal;
switched capacitor (SC) circuitry coupled to the analog circuitry;
analog to digital converter (ADC) circuitry connected to an analog output of the analog circuitry; and
logic circuitry coupled to an output of the ADC circuitry and configured to:
compute error mitigation codes based on ADC output data to mitigate pole-zero (PZ) doublet errors; and
transmit the error mitigation codes to calibrate the SC circuitry.

2. The integrated circuit of claim 1, wherein the logic circuitry is further configured to:
enter an iterative search loop, up to a maximum iteration value;
detect if the ADC output data is rising or falling;
if the ADC output data is falling:

measure a first ADC output data value after a falling edge of a square wave applied to the analog circuitry; and measure a second ADC output data value before a rising edge of the square wave applied to the analog circuitry;

if the ADC output data is rising:

measure the first ADC output data value after the rising edge of the square wave applied to the analog circuitry; and measure the second ADC output data value before the falling edge of the square wave applied to the analog circuitry;

compute a difference value between the first ADC output data value and the second ADC output data value;

compare the difference value to a maximum error value;

compute a new calibration code based on the difference value; and perform repeated iterations of the iterative search loop to compute a final error mitigation code.

3. The integrated circuit of claim 1, wherein the error mitigation codes include calibration trim bits.

4. An error mitigation system, comprising:
analog circuitry configured to receive an analog signal at an analog input;
switched capacitor (SC) circuitry coupled to the analog circuitry;
analog to digital converter (ADC) circuitry, coupled to the analog circuitry, producing ADC output data; and
logic circuitry coupled to the ADC circuitry configured to:
compute error mitigation codes to mitigate pole-zero (PZ) doublet errors; and
transmit the error mitigation codes to calibrate the SC circuitry.

5. The error mitigation system of claim 4, wherein the error mitigation codes include calibration trim bits.

6. The error mitigation system of claim 4, further comprising:
a first SC circuitry, of the SC circuitry, connected between a first control device and the analog input;
a second SC circuitry, of the SC circuitry, connected between a second control device and the analog input; and
an analog output.

7. The error mitigation system of claim 6, further comprising:
a first control input on the first control device; and
a second control input on the second control device.

8. The error mitigation system of claim 7, wherein:
the first SC circuitry is coupled to the first control input; and
the second SC circuitry is coupled to the second control input.

9. The error mitigation system of claim 8, wherein:
the first control device comprises a first transistor; and
the second control device comprises a second transistor.

10. The error mitigation system of claim 9, wherein:
the first transistor comprises a first drain, a first control gate, and a first source; and
the second transistor comprises a second drain, a second control gate, and a second source.

11. The error mitigation system of claim 10, wherein:
the first control input comprises the first control gate of the first transistor;

a second control input comprises the second control gate of the second transistor; and
the analog output is connected to the first drain of the first transistor and to the second drain of the second transistor.

12. The error mitigation system of claim 4, wherein the logic circuitry is further configured to:
compute an initial midcode calibration code;
apply the midcode calibration code to the SC circuitry;
enter an iterative search loop, up to a maximum iteration value;
within the iterative search loop, repeatedly measure SC circuitry error values; and
within the iterative search loop, repeatedly adjust a calibration code until a final SC circuitry error value is less than a maximum error value.

13. The error mitigation system of claim 12, wherein the logic circuitry is further configured to:
enter an iterative search loop, up to a maximum iteration value;
detect a rising or falling edge of the ADC output data;
if the ADC output data is falling:
measure a first ADC output data value after a falling edge of a square wave applied to the analog circuitry; and
measure a second ADC output data value before a rising edge of the square wave applied to the analog circuitry;
if the ADC output data is rising:
measure the first ADC output data value after the rising edge of the square wave applied to the analog circuitry; and
measure the second ADC output data value before the falling edge of the square wave applied to the analog circuitry;
compute a difference value between the first ADC output data value and the second ADC output data value;
compare the difference value to a maximum error value;
compute a new calibration code based on the difference value; and
perform repeated iterations of the iterative search loop to compute a final error mitigation code.

14. A method for mitigating errors, comprising:
providing switched capacitor (SC) circuitry coupled to an input of analog to digital converter (ADC) circuitry;
receiving output data from the ADC circuitry;
computing error mitigation codes based on the output data to mitigate pole-zero (PZ) doublet errors; and
transmitting the error mitigation codes to the SC circuitry to calibrate the SC circuitry.

15. The method of claim 14 for mitigating errors wherein the error mitigation codes include calibration trim bits.

16. The method of claim 14 for mitigating errors, further comprising:
providing analog circuitry coupled to the ADC circuitry;
providing SC error mitigating circuitry coupled to the analog circuitry;
providing ADC output data; and
providing logic circuitry configured to compute SC circuitry error mitigation codes.

17. The method of claim 16 for mitigating errors, further comprising:
computing an initial midcode calibration code;
applying the midcode calibration code to the SC circuitry;
entering iterative search loops, up to a maximum iteration value;

within the iterative search loops, repeatedly measuring SC circuitry error values; and within the iterative search loops, repeatedly adjusting error mitigation codes until a final error value is less than a maximum error value.

18. The method of claim 17 for mitigating errors, further comprising:
measuring a first output data value;
measuring a second output data value;
computing a difference value between the first output data value and the second output data value;
comparing the difference value to a maximum error value;
computing a new calibration code based on the difference value; and
performing repeated iterations to compute a final error mitigation code.

19. The method of claim 14 for mitigating errors, further comprising:
injecting a square wave into analog circuitry coupled to the SC circuitry;
computing a midcode calibration code;
applying the midcode calibration code to the SC circuitry;
providing a maximum iteration value;
initializing an iteration integer and entering an iteration loop;
detecting if an output data value is rising or falling;
if the output data value is rising:
    computing a first calibration code by measuring the output data value after a rising edge of the square wave; and
    computing a second calibration code by measuring the output data value before a falling edge of the square wave;
computing a difference value by subtracting the first calibration code from the second calibration code;
computing a new calibration code based on the difference value;
repeating the iteration loop while a maximum error value and the difference value are not equal;
incrementing the iteration integer; and
exiting the iteration loop when the iteration integer equals the maximum iteration value.

20. The method of claim 14 for mitigating errors, further comprising:
computing a midcode calibration code;
applying the midcode calibration code to the SC circuitry;
injecting a square wave into the analog;
providing a maximum iteration value;
initializing an iteration integer and entering an iteration loop;
detecting if an output data value is rising or falling;
if the output data value is falling:
    computing a first calibration code by measuring the output data value after a falling edge of the square wave; and
    computing a second calibration code by measuring the output data value before a rising edge of the square wave;
computing a difference value by subtracting the second calibration code from the first calibration code;
computing a new calibration code based on the difference value;
repeating the iteration loop while a maximum error value and the difference value are not equal;
incrementing the iteration integer; and
exiting the iteration loop when the iteration integer equals the maximum iteration value.

* * * * *